United States Patent [19]
Takada

[11] Patent Number: 4,667,310
[45] Date of Patent: May 19, 1987

[54] LARGE SCALE CIRCUIT DEVICE CONTAINING SIMULTANEOUSLY ACCESSIBLE MEMORY CELLS

[75] Inventor: Tomoji Takada, Kawasaki, Japan

[73] Assignee: Kabushiki Kaisha Toshiba, Kawasaki, Japan

[21] Appl. No.: 681,485

[22] Filed: Dec. 13, 1984

[30] Foreign Application Priority Data

Dec. 14, 1983 [JP] Japan ................ 58-235475

[51] Int. Cl.⁴ .............................. G11C 11/34
[52] U.S. Cl. ................................ 365/154; 365/190
[58] Field of Search ............... 365/154, 155, 156, 190

[56] References Cited

U.S. PATENT DOCUMENTS 4,447,894  5/1984  Imamura ............................ 365/154
4,578,780  3/1986  Baba ................................... 365/190

FOREIGN PATENT DOCUMENTS 53-43578  4/1978  Japan .
55-78561  6/1980  Japan .
58-199539  11/1983  Japan .

Primary Examiner—James W. Moffitt
Attorney, Agent, or Firm—Finnegan, Henderson, Farabow, Garrett & Dunner

[57] ABSTRACT

A master slice type LSI is constructed as a three port memory circuit in which respective cells exclusively utilized as memory circuits constituting respective memory regions can be accessed simultaneously. More particularly each cell exclusively used as a memory circuit is constituted by a flip-flop circuit including two inverters (31, 32) which are connected in parallel opposition, a single write data input line (39) and two read out data output lines (40, 41) which are connected to the flip-flop circuit through transfer gate circuits (33,34,35), respectively, and at least three word lines (36, 37, 38) along which independent word signals are transmitted. The three transfer gate circuits (33, 34, 35) are independently enabled and disenabled based on the word signals transmitted over the word lines (36, 37, 38).

6 Claims, 5 Drawing Figures

LARGE SCALE CIRCUIT DEVICE CONTAINING SIMULTANEOUSLY ACCESSIBLE MEMORY CELLS

BACKGROUND OF THE INVENTION

This invention relates to a semiconductor integrated circuit device (hereinafter termed a LSI) of the master slice type and more particularly a LSI wherein a region contained in the LSI exclusively used as a memory circuit is suitable for use as a register.

The master array system, also called a gate array, is usually prepared by forming on a semiconductor wafer a master chip in which a plurality of fundamental cells including a plurality of elements (including active elements such as transistors and passive elements such as resistors or the like) are integrated, coupling the elements in the fundamental cell to construct a logic circuit having desired logic performances and then connecting a plurality of such logic circuits to form a desired LSI.

FIG. 1 shows a conventional circuit construction of a cell contained in a gate array chip prepared in this manner and used exclusively as a memory circuit.

In this circuit, inverters 10 and 11 have the same size and the same electric characteristics and are connected in parallel opposition to form a flip-flop circuit. Gate circuits 12 and 13 are provided to act as transfer gate circuits to connect the flip-flop circuit to bit wires 14 and 15 respectively at the time of reading and writing data. The gate circuits 12 and 13 are enabled and disenabled by access signals for a memory circuit which are supplied to a word line 16 from an address decoder, not shown. The circuit is further provided with write drivers 17 and 18 which output data to be written onto the bit wires 14 and 15 at the time of writing data, and a sense amplifier 19 which shapes and amplifies the waveform of a slight voltage variation of bit lines 14 and 15 to obtain a voltage sufficient for reading.

A memory circuit having a construction described above is suitable for use as a memory circuit of a large capacity because it is possible to make small the memory cell area, but has the following disadvantage for use as a memory circuit contained in a gate array.

More particularly, in the gate array, in most cases, the memory circuit is utilized as a register group so that the memory circuit is required to effectively function as the register group. However, in the memory circuit described above, only one of reading and writing of data is possible so that such memory circuit is not effective as the memory group. This will be described with reference to FIG. 2.

In FIG. 2, 20 designates a register group utilizing the memory cell shown in FIG. 1 which comprises three addresses, A, B and C. 21 and 23 respectively designates single registers and 22 an arithmetic operation circuit executing a calculation Z.

Where the memory circuit is used as registers it is a usual practice to subject the content of the address A of the register group 20 and the content of the address B to an arithmetic operation Z and to store the result of the arithmetic operation in the address C. With the prior art memory circuit shown in FIG. 1, whether the data is read out or written, only one access can be made during one clock so that in order to use the memory circuit as registers, the following three step operations are necessary.

1. Read out the content of address A of the register group 20 and store the read out content in the other register 21 (the content thereof being designated by R1.)

(R1)←(content of address A)

2. Read out the content of address B of the register group 20 and subject the read out content and the content (R1) of the register 21 to arithmetic operation Z of the arithmetic operation circuit 22 and store the result of calculation in other register 23 (the content thereof being designaged by R2), then, (R2)←(R1) Ⓩ (content of address B)

3. Read out the content (R2) of the register 23 and write the read out content in address C of register group 20, thus (Content of address C)←(R2)

As above described, where the prior art memory circuit is used as a register group, a general processing described above (a method of processing now being used generally) requires a processing time corresponding to 3 clocks. This means that the construction described above prevents improvements of the processing ability of the LSI as a whole.

Furthermore, the prior art memory circuit shown in FIG. 1 has the following disadvantages.

More particularly, a logic circuit utilizing a gate array is generally designed by a user not having a sufficient knowledge about semiconductor devices to realize that it is desired that various component elements constituting the gate array should have suitable operating margins for facilitating timing control or the like, since the operation of the memory circuit described above is complicated and difficult to effect proper timing control. Moreover, since the prior art memory circuit includes a sense amplifier 19 having a small operating margin, it is very difficult for the user to design the logic circuit.

SUMMARY OF THE INVENTION

Accordingly, it is an object of this invention to provide an improved LSI including a cell exclusively used as memory means and capable of greatly improving the operating efficiency when a region exclusively used as the memory region is used as the register group in a manner as above described.

Another object of this invention is to provide a novel LSI capable of facilitating the timing control of the cell exclusively used as the memory means and hence facilitating the logical design of the gate array.

According to this invention, there is provided a semiconductor integrated circuit device of the master slice type and comprising a semiconductor chip containing a plurality of fundamental cells which are integrated in a matrix, and a plurality of cells exclusively utilized as memory cells which constitute regions exclusively utilized as memory circuits, the integrated device manifesting desired logical performances based on a manner of wirings among respective cells, characterized in that each one of the cells exclusively utilized as the memory circuits comprises first, second and third word lines respectively transmitting three independent word signals, first and second read out data output lines, a write data input line, first and second inverters connected in parallel opposition for constituting a flip-flop circuit, a first transfer gate circuit enabled by a word signal transmitted over the first word line for interconnecting the first read out data output line and the output terminal of the first inverter, a second transfer gate circuit enabled by a word signal transmitted over the second word line for interconnecting the second read out data output line and the output terminal of the first inverter, and a third transfer gate circuit enabled by a word signal transmitted over the third word line for interconnecting the write data input line and the output terminal of the second inverter.

More particularly, the cell exclusively utilized as the memory cell is so designed that it may function as a simultaneously accessible 3-port memory. Thus, the processing of data can be executed for one clock period when the region exclusively utilized as memory is used as a register.

Furthermore, according to this invention, it is so constructed that, of the two inverters constituting the flip-flop circuit, the first inverter associated with data reading requires a large drive current and the second inverter associated with data writing requires a small drive current so as to easily invert data by a voltage signal supplied from outside. By the above construction, it became possible to realize a memory circuit capable of performing stable reading and writing operations without using a sense amplifier having a small operating margin and difficult to effect proper timing control, which is difficult for the user to design logic circuits.

In case that the electric current flowing in the second inverter via the write data input line is large enough to invert the output level of the flip-flop circuit, the same effect as described above can be achieved without using inverters of two different electric characteristics.

As described above, the LSI according to this invention enables great improvements in data processing efficiency when the region exclusively utilized as memory is used as a register. In adition, the difficulty involved in the logic designing can be preferably eliminated. As a result, the data processing capability of the LSI is enhanced.

Thus, the LSI of this invention can be widely used in different applications.

DESCRIPTION OF THE PREFERRED EMBODIMENT

Figure 3:
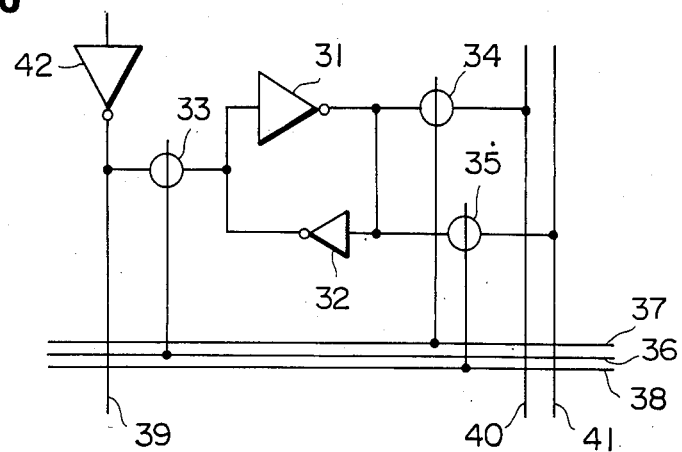
FIG. 3 is a connection diagram showing the circuit construction of the cell exclusively used as a memory circuit in the LSI according to this invention.

FIG. 3 shows one embodiment of a LSI according to this invention. In FIG. 3, the circuit construction of only a cell exclusively utilized as a memory circuit which is the principal element of this invention will be described and other elements are not shown and described.

Figure 1:
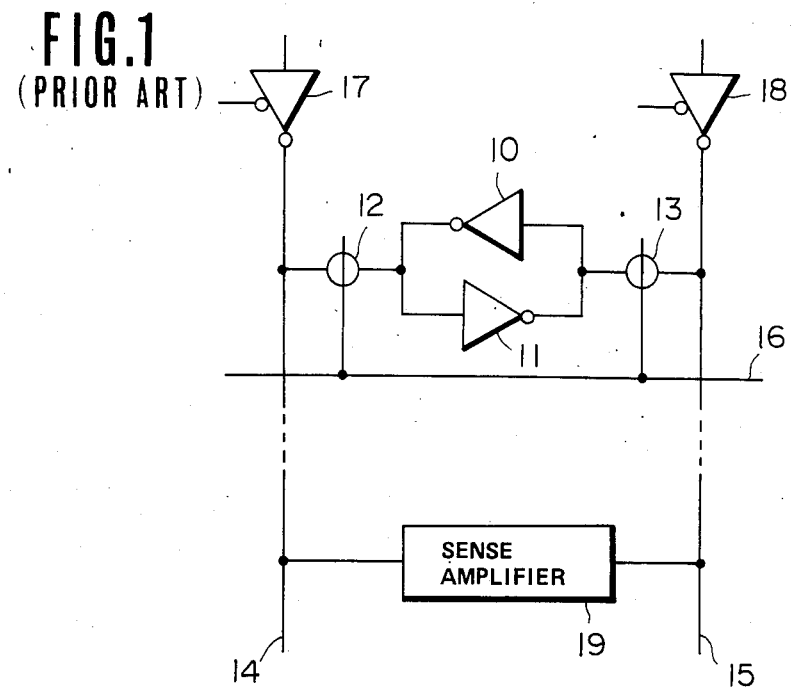
FIG. 1 shows the circuit construction of a cell exclusively used as a memory circuit of a prior art LSI.
Figure 2:
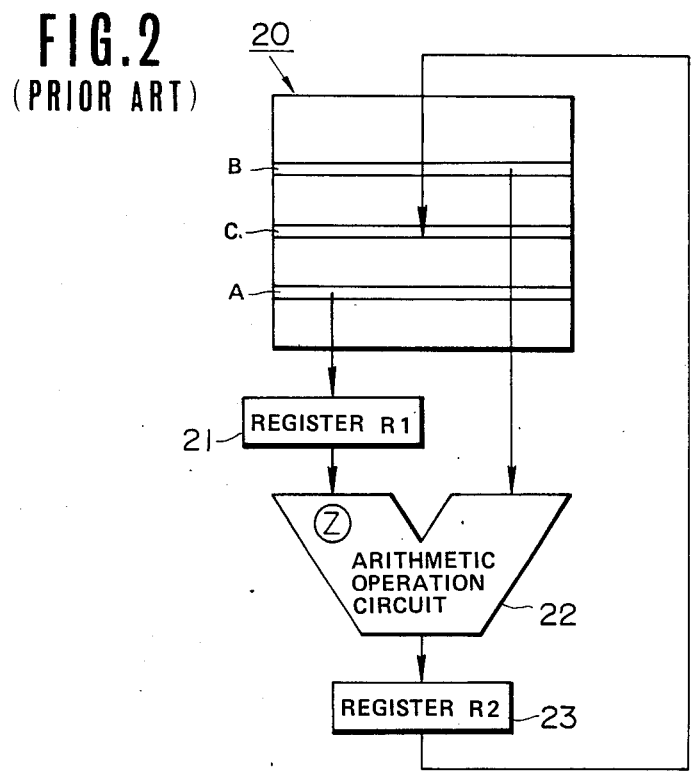
FIG. 2 is a performance block diagram showing one example of a data processing performance of a case wherein a register group is constituted by the cell having the construction as shown in FIG. 1 and is used exclusively as a memory circuit.

In the memory circuit shown in FIG. 3, inverters 31 and 32 are used to constitute a flip-flop circuit in the same manner as in FIG. 1, with input and output terminals connected as shown in FIG. 3. Of these two inverters, inverter 31 requires a sufficiently large drive current whereas inverter 32 requires a small drive current sufficient to readily invert the state of the flip-flop circuit by current flowing through a gate circuit 33 to be described later. The gate circuit 33 is used to convert the flip-flop circuit to a write data input line 39, a transfer gate circuit 34 is provided to connect the flip-flop circuit with a first read out data output line 40, while a transfer gate circuit 35 is provided to connect the flip-flop circuit to a data output line 41. The gate circuits 33, 34 and 35 are enabled or disenabled independently based on word signals (access signal of the memory circuit) independently sent to word lines 36, 37 and 38 from an address decoder, not shown. A write driver 42 is provided for outputting write data to the data input line 39 at the time of writing data.

Concequently, at the time of driving the memory circuit when a word signal is transmitted to the word line 36 to change its signal level to a logic H level the write transfer gate 33 is enabled so as to supply the data on the write data input line 39 to the flip-flop circuit, whereas when a word signal is supplied to the word line 37 or 35 to change its signal level to the logic H, the transfer gate circuits 34 and 35 are enabled to output the data stored in the flip-flop circuit into the data output lines 40 and 41. As above described, the inverter constituting, the flip-flop circuit requires sufficiently large current drive so that even when the output node of the inverter 31 is connected to either one or both of the data output lines 40 and 41 the level variation of the output node of the inverter 31 caused by the charge share between the sum of the capacitance of these output (bit) wires and the capacitance of the output node of the inverter 31 is sufficiently small so that the level of the read out data would not exceed the threshold voltage of the other inverter 32.

As above described, the memory circuit can independently operate one write data input line 39 and two read out data output data lines 40 and 41. Thus, the memory circuit functions as a 3 port memory circuit accessible at the same time.

A manner of processing data of a case in which a register group is constituted by the cell exclusively utilized as the memory circuit will be described with reference to FIG. 4.

Figure 4:
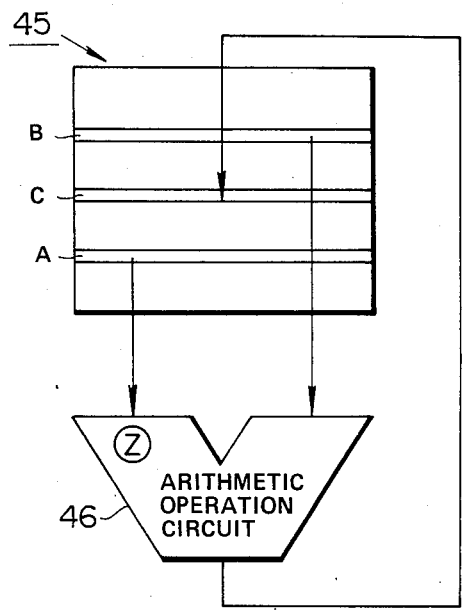
FIG. 4 is a performance block diagram showing one example of data processing of a case wherein a register group is constituted by a cell exclusively used as a memory circuit and having a construction as shown in FIG. 3.

FIG. 4 is a performance block diagram showing the manner of data processing of the embodiment of FIG. 3 and corresponds to the manner of data processing of a case wherein the register group is constituted by the prior art cell exclusively used as a memory circuit.

In FIG. 4, 45 shows a register group utilizing a cell exclusively utilized as a memory circuit and having a circuit construction as shown in FIG. 3, while 46 shows an arithmetic operation circuit executing an arithmetic operation Z.

The cell exclusively utilized as the memory cell which constitutes the register group 45 takes the form of a 3 port memory circuit in the same manner as above described. Since such memory circuit can execute all write and read operations in one clock, the register group 45 can execute in only one clock. The processing involves the contents of addresses A and B being subjected to an arithmetic operation Z and the result of the arithmetic operation being stored in address C. More particularly, processing of simultaneously reading out the contents of addresses A and B of the register group 45, subjecting the read out contents to the arithmetic operation Z, and writing the result of the arithmetic operation in the address C of the register group 45, namely (content of address C)←(content of address A) $\oslash$
(content of address B)

can be made in one clock period.

Since the LSI of this embodiment is of a gate array type, some user may use it in different manners. In such cases, optimum wirings can be made by utilizing the fact that the LSI is of the master slice type. For example, it is possible to use the memory circuit shown in FIG. 3 as a one port or two port memory circuit. Since in this embodiment only 3 sets of address decoders are used, the invention can not be applied to a memory circuit having four or more ports, but the field of application requiring a memory circuit having four or more ports is seldom so that the invention can be used in nearly all applications.

As shown in FIG. 3, where a flip-flop circuit is constituted by two inverters 31 and 32 having greatly different current drive forces without utilizing a sense amplifier as in FIG. 1, one may think that the area per cell becomes larger than the prior art memory circuit shown in FIG. 1 and hence the efficiency of the effectively used area of the gate array becomes lower. In this gate array, however, the wirings are installed at the upper portions of respective cells exclusively used as the memory circuits so that the actual occupation area of a cell is not equal to that of the passive element, but is determined by the minimum width of the wiring and the minimum spacing between the wirings, thus causing no problem. More particularly, in the actual construction of the 3 port memory circuit of this invention, six signal wires including three word lines and three bit lines, and as a source line are formed on respective cells exclusively used as memory circuits. Consequently, as long as the width of the wiring and spacing between wirings are substantially the same as those of the prior art, the areas occupied by the regions exclusively used as the memory circuits would be the same whether the cell construction is of the prior art LSI or of the LSI of this invention.

Figure 5:
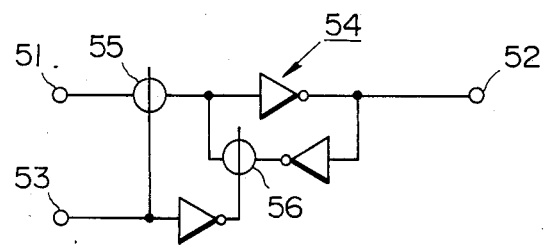
FIG. 5 is connection diagram showing one example a data latch circuit suitable to be connected with a memory circuit of the LSI according to this invention.

When the cell exclusively used as the memory circuit is constructed as shown in FIG. 3, it is possible to make stable data writing and read out, but where a data latch circuit is added as shown in FIG. 5, even when data are simultaneously read out from a cell which has been written with data, it is possible to more distinctly identify whether the read out data are written before or after writing.

The data latch circuit shown in FIG. 5 comprises an input terminal 51, an output terminal 52, a latch enabling terminal 53, a flip-flop circuit 54, a transfer gate circuit 55 which is enabled when the logic level of a signal supplied to the latch enabling terminal 53 becomes "H" and a transfer gate circuit 56 which is enabled when the logic level of a signal applied to the latch enabling terminal 53 becomes "L". The input terminal 51 is connected to the read out data output lines 40 and 41 of the memory circuit shown in FIG. 3 and when an inverted signal of a write word signal of the memory circuit is applied to the latch enabling terminal 53 while data are being written into the cell, even when the read out data vary, the data finally read out before the write data arrive would be held in the flip-flop circuit. Even when the data latch circuit is added. The advantage of the memory circuit that enables simultaneous access in one clock can be assured.

What is claimed is:

1. A semiconductor memory circuit of the master slice type and comprising a semiconductor chip containing a plurality of basic cells which are integrated in a matrix, and a plurality of cells exclusively utilized as memory cells which constitute regions exclusively utilized as memory circuits, said memory device manifesting desired logical performances based on a manner of wirings among respective cells, wherein each one of said cells exclusively utilized as said memory circuits comprises:

first, second and third independent word lines for respectively transmitting three independent word signals;

first and second independent read data output lines and a write data input line;

first and second inverters connected in parallel opposition to form a flip-flop circuit;

first transfer gate means, enabled by a word signal transmitted over said first word line, for interconnecting said first read out data output line and the output terminal of said first inverter;

second transfergate means, enabled by a word signal transmitted over said second word line, for interconnecting said second read out data output line and the output terminal of said first inverter; and third transfer gate means, enabled by a word signal transmitted over said third word line, for interconnecting said write data input line and the output terminal of said second inverter.

2. A semiconductor memory circuit of claim 1 wherein said first inverter has a sufficiently large current drive power such that even when the output terminal of said first inverter is connected to either one or both of said first and second read out data lines said first and second inverters will maintain their output logic level, whereas said second inverter has a relatively small current drive power such that when the output terminal of said second inverter is connected to said write data input line, the output logic level of said first and second inverters will be inverted.

3. A semiconductor memory circuit of claim 1 further comprising data latch means for latching firstly read out data before arrival of write data, while data are being written into said first and second inverters.

4. A semiconductor memory circuit of claim 3 wherein said data latch means comprises third and fourth inverters connected in parallel opposition to form a second flip-flop circuit which latches said read out data, transfer gate means, contained between the input of said third inverter and the output said fourth inverter, for enabling said third and fourth inverters based on a word signal transmitted over said third word line and another transfer gate means for interconnecting said first read out data output line or said second read out data line and said third and fourth inverters based on an inverted logic signal of said word signal transmitted over said third word line.

5. A semiconductor memory circuit for use in a large scale integrated circuit, comprising:

first and second inverters, wherein an input terminal of said first inverter is interconnected to an output terminal of said second inverter and an output terminal of said first inverter is connected to an input terminal of said second inverter to form a flip-flop circuit;

first and second tramsmission gates; and wherein a connection point of the input terminal of said first inverter and the output terminal of said second inverter is interconnected to a write data input line via said first transmission gate, a connection point of the output terminal of said first inverter and the input terminal of said second inverter is interconnected to at least one read out data input line via at least one said second transmission gate, said first and second transmission gates being opened or closed in response to word signals applied to respective word lines, said first inverter having a current drive power whose value is large enough to maintain an output logic level of said first and second inverters even when the output terminal of said first inverter is electrically connected to one or more read out data lines, and whereas said second inverter has a relatively small current drive power so that when the output terminal of said second inverter is electrically connected tosaid write data input line the output logic level of said first and second inverters will be inverted.

6. A semiconductor memory circuit for use in a large scale integrated (LSI) circuit, comprising:

first, second and third independent word lines for respectively transmitting three independent word signals;

first and second independent read data output lines and a write data input line;

first and second inverters connected in parallel opposition to form a flip-flop circuit;

first transfer gate means, enabled by a word signal transmitted over said first word line, for interconnecting said first read out data output line and the output terminal of said first inverter;

second transfer gate means, enabled by a word signal transmitted over said second word line, for interconnecting said second read out data output line and the output terminal of said first inverter; and third transfer gate means, enabled by a word signal transmitted over said third word line, for interconnecting said write data input line and the output terminal of said second inverter.

* * * * *